United States Patent
Chawandi

(10) Patent No.: US 9,496,843 B1
(45) Date of Patent: Nov. 15, 2016

(54) SMART VOLUME GUARD

(71) Applicant: Nagravision S.A., Cheseaux-sur-Lausanne (CH)

(72) Inventor: Prabhu Chawandi, Bangalore (IN)

(73) Assignee: Nagravision S.A., Cheseaux-sur-Lausanne (CH)

( * ) Notice: Subject to any disclaimer, the term of this patent is extended or adjusted under 35 U.S.C. 154(b) by 0 days.

(21) Appl. No.: 14/832,822

(22) Filed: Aug. 21, 2015

(51) Int. Cl.
*H03G 7/00* (2006.01)
*H03G 11/00* (2006.01)

(52) U.S. Cl.
CPC .............. *H03G 7/004* (2013.01); *H03G 7/007* (2013.01); *H03G 11/008* (2013.01)

(58) Field of Classification Search
None
See application file for complete search history.

(56) References Cited

U.S. PATENT DOCUMENTS

| | | | |
|---|---|---|---|
| 2007/0206820 A1* | 9/2007 | Ikawa | H03G 1/0088 381/104 |
| 2009/0274322 A1 | 11/2009 | Chang et al. | |
| 2012/0250874 A1 | 10/2012 | Liu | |
| 2015/0326913 A1* | 11/2015 | Verchykov | H03G 3/342 725/34 |
| 2016/0103653 A1* | 4/2016 | Jang | H03G 3/20 381/107 |

FOREIGN PATENT DOCUMENTS

WO   WO 2014113471 A1 *  7/2014 ............ H03G 9/005

OTHER PUBLICATIONS

"Scion Audio System: Toyota Part No. PT546-00120", Owner's Manual for AM/FM/HD Radio Broadcast/CD Player With iPod/USB Control/Bluetooth-Audio, [Online]. [Archived Mar. 15, 2015]. Retrieved from the Internet: <URL: https://web.archive.org/web/20150319000150/http://www.scion.com/assets/pdf/audio/2012_Pioneer_Audio.pdf>, (2012), 64 pgs.

"Terk VR1 Automatic TV Volume Controller", Amazon, [Online]. Retrieved from the Internet: <URL: https://www.amazon.com/Audiovox-Terk-Automatic-Volume-Controller/dp/B00008VWOJ/ref=sr_1_1?ie=UTF8&qid=1360861505&sr=8-1&keywords=terk+volume>, (Accessed: Sep. 8, 2016), 6 pgs.

Schneider, Len, "The Ultimate Insider's Guide to High Performance Home Theater", Rotel Home Theater, (2012), 386 pgs.

Techbitar, "TV Volume Loudness Guard Using Arduino", Instructables (Technology), [Online]. Retrieved from the Internet: <URL: http://www.instructables.com/id/TV-Volume-Loudness-Guard-using-Arduino/?ALLSTEPS>, (Posted: Feb. 10, 2013), 14 pgs.

* cited by examiner

*Primary Examiner* — Paul Huber
(74) *Attorney, Agent, or Firm* — Schwegman Lundberg & Woessner, P.A.

(57) ABSTRACT

Aspects of the present disclose involve a method, a device, and a system comprising a processor and a machine-readable storage medium storing a set of instructions for providing audio level safeguards for output audio signals. In example embodiments, the method includes accessing a most recent audio level of an audio output device and determining whether the most recent audio level transgresses a threshold value. Based on determining the most recent audio level transgresses the threshold value, a current audio level output by the audio output device is set to the threshold value. Thereafter, the current audio level is gradually increased, at repeated time intervals, until it reaches the most recent audio level.

20 Claims, 6 Drawing Sheets

SMART VOLUME GUARD

TECHNICAL FIELD

The subject matter disclosed herein relates to audio devices. In particular, example embodiments may relate to audio output of audio devices.

BACKGROUND

Sound waves have three basic parameters: 1) Pitch; 2) Quality; and 3) Loudness. Pitch relates to the frequency of the sound wave. Quality is used to describe the quality of a waveform as it is perceived by a listener. Loudness relates to the physiological sensation of sound that depends on the amplitude of the sound wave.

The human ear is sensitive and may react differently to varied levels of loudness. For example, sound may be pleasant to the ear when it is at the level of normal conversation (e.g., 55 dB-65 dB) but, at a higher power, sound may be frightening or disturbing to listeners. As an example, an individual may enjoy watching television at a certain level of loudness to overcome ambient noise. However, if the individual shuts down the television, and later returns to watch television when no such ambient noise is present, the abrupt return of the television to the same level of loudness may be jarring for the individual and disturbing for others nearby.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure involve an audio output device configured to provide audio level safeguards for output audio signals. The terms "audio level," "sound level" and "volume" may be used synonymously herein to refer to the measure of loudness of an audio signal. The loudness of audio signals may be measured, for example, in decibels (dB), and therefore, audio levels may include a dB value.

In example embodiments, the audio output device is configured to store the last audio level prior to being turned off. When the audio output device is turned back on, before presenting decoded audio samples to an audio producing component (e.g., speakers), an audio output component included in the audio output device determines whether the last audio level of the audio output device transgresses a predefined value, which, in some embodiments, is based on a measure of loudness that is comfortably heard by listeners such as the loudness of typical conversation (e.g., 55 dB-65 dB). If the stored audio level is below the threshold value, the audio output component sets the current audio level of the audio output device to the value of the stored audio level.

If the stored audio level is at or above the threshold value, the audio output component sets the initial audio level of the audio output device to the threshold level. Thereafter, the audio output component gradually increases the audio level of the audio output device in steps (e.g., according to a stepwise function). For example, the audio output component repeatedly increases the audio level by an incremental value at various time intervals. In this way, listeners will be better prepared for an abrupt change from no audio to a high level of audio (e.g., an audio level above the predefined threshold). This may avoid an injury to the listeners' hearing or a shock to the listeners from sudden loudness, which can be frightening to some (e.g., children or the elderly).

If a user intervenes (e.g., by pressing a button on a remote control of the audio output device), then the audio output component will stop increasing the audio level. Otherwise, the audio output component increases the audio level until it reaches the stored audio level (e.g., the last audio level of the audio output device prior to being turned-off).

Figure 1:
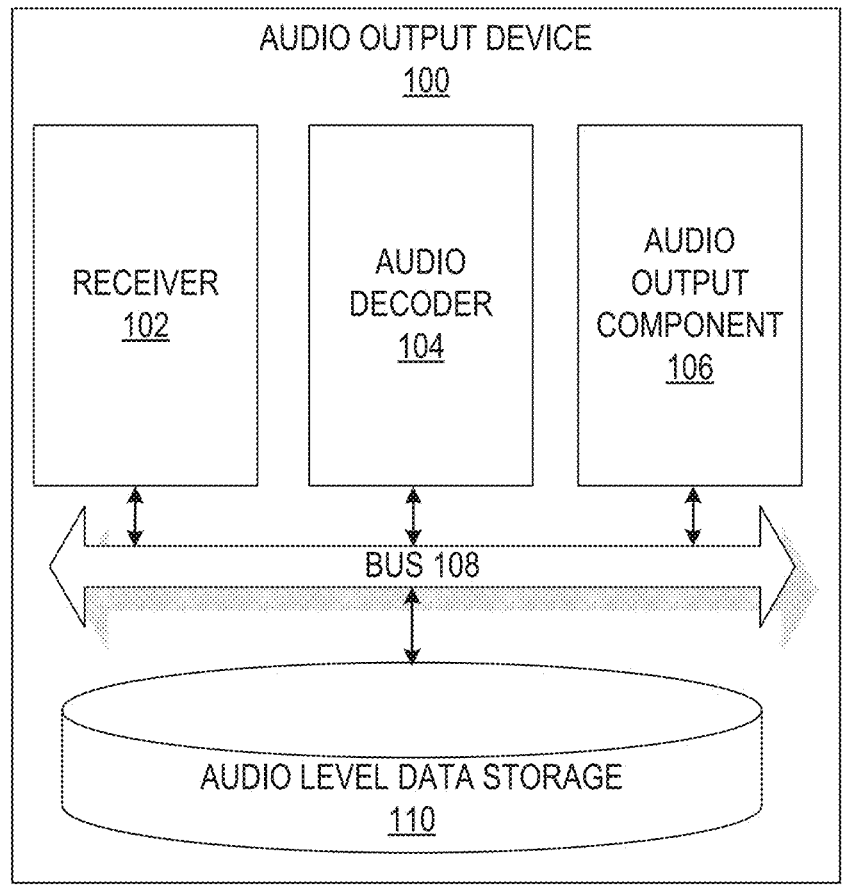
FIG. 1 is a system diagram illustrating various functional components of an audio output device configured to provide audio level safeguards, according to some example embodiments.

FIG. 1 is a system diagram illustrating various functional components of an audio output device 100 configured to provide audio level safeguards, according to some example embodiments. The audio output device 100 corresponds to any device configured to output an audio signal (e.g., a soundwave) and is not intended to be limited to devices that solely output audio signals. For example, the audio output device 100 may correspond to a television, an audio video receiver, a stereo system, a portable music player, a computer, or any other device capable of outputting an audio signal to a device that produces sound (e.g., speakers or headphones).

To avoid obscuring the inventive subject matter with unnecessary detail, various functional components that are not germane to conveying an understanding of the inventive subject matter have been omitted from FIG. 1. However, a skilled artisan will readily recognize that various additional functional components may be included in the audio output device 100 to facilitate additional functionality that is not specifically described herein. For example, in some embodiments, the audio output device 100 may be coupled to or have an embedded device or set of devices to produce sound (e.g., speakers or headphones). Furthermore, it shall be appreciated that while the functional components of FIG. 1 are discussed in the singular sense, in other embodiments, multiple instances of one or more of the modules may be employed. As is understood by skilled artisans in the relevant computer arts, each component illustrated in FIG. 1 may represent a hardware component, a set of hardware components, or a set of logic (e.g., executable software instructions) and the corresponding hardware (e.g., memory and processor) for executing the set of logic.

As illustrated in FIG. 1, the audio output device 100 includes a receiver 102, an audio decoder 104, and an audio output component 106, all configured to be in communication with each other via a bus 108 so as to allow information to be passed between the functional components or so as to allow the functional components to share and access common data. Additionally, each of the functional components illustrated in FIG. 1 may access and retrieve data from audio level data storage 110, which is a machine-readable medium that stores audio level data that includes previous audio levels of the audio output device 100.

The receiver 102 is configured to receive encoded audio data from an audio source as an input to the audio output device 100. The audio source may be an audio file, a radio frequency modulator, a compact disc, or the like. The receiver 102 passes the received encoded audio data to the audio decoder 104, which is responsible for decoding the encoded audio data and providing the resulting decoded audio data to the output component 106 for eventual output to one or more audio producing devices.

The audio output component 106 may be a hardware implemented module, a software program (e.g., a driver) executed by a machine (e.g., a processor), or a set of instructions stored on a machine-readable medium that is configured to output an audio signal based on the decoded audio data, and provide audio level safeguards by controlling and modulating the audio level (e.g., degree of loudness) of the output audio signal. For example, prior to the audio output device 100 being placed in a non-operational state (e.g., being turned off), the audio output component 106 stores the last audio level of the audio output device 100 in the audio level data storage 110. In response to the audio output device 100 being returned to an operational state (e.g., turned-on), the audio output component 106 accesses the stored audio level and determines whether it is above a reference threshold value (e.g., a value above which the loudness of the audio signal may be disturbing or frightening to nearby persons). If the value of the stored audio level is below the threshold, the audio output device 100 sets the audio level of the audio output device 100 to the stored audio level (e.g., the volume of the audio device prior to being turned-off).

On the other hand, if the value of the stored audio level is at or above the reference threshold value, the audio output device 100 sets the audio level to the reference threshold value and thereafter gradually increases the audio level (e.g., by increasing the amplitude of the output audio signal) until it reaches the stored audio level. The audio output device 100 may increase the audio level by an incremental value and at an interval that is likely to be unnoticed by listeners (e.g., a value below the just noticeable difference (JND) of sound intensity of the human ear). In this way, the audio output component 106 prepares listeners for a high measure of loudness by avoiding the surprise of an abrupt change from a low audio level (e.g., no audio or simply just ambient noise) to the previous high audio level (e.g., the last audio level of the audio output device 100).

Figure 2:
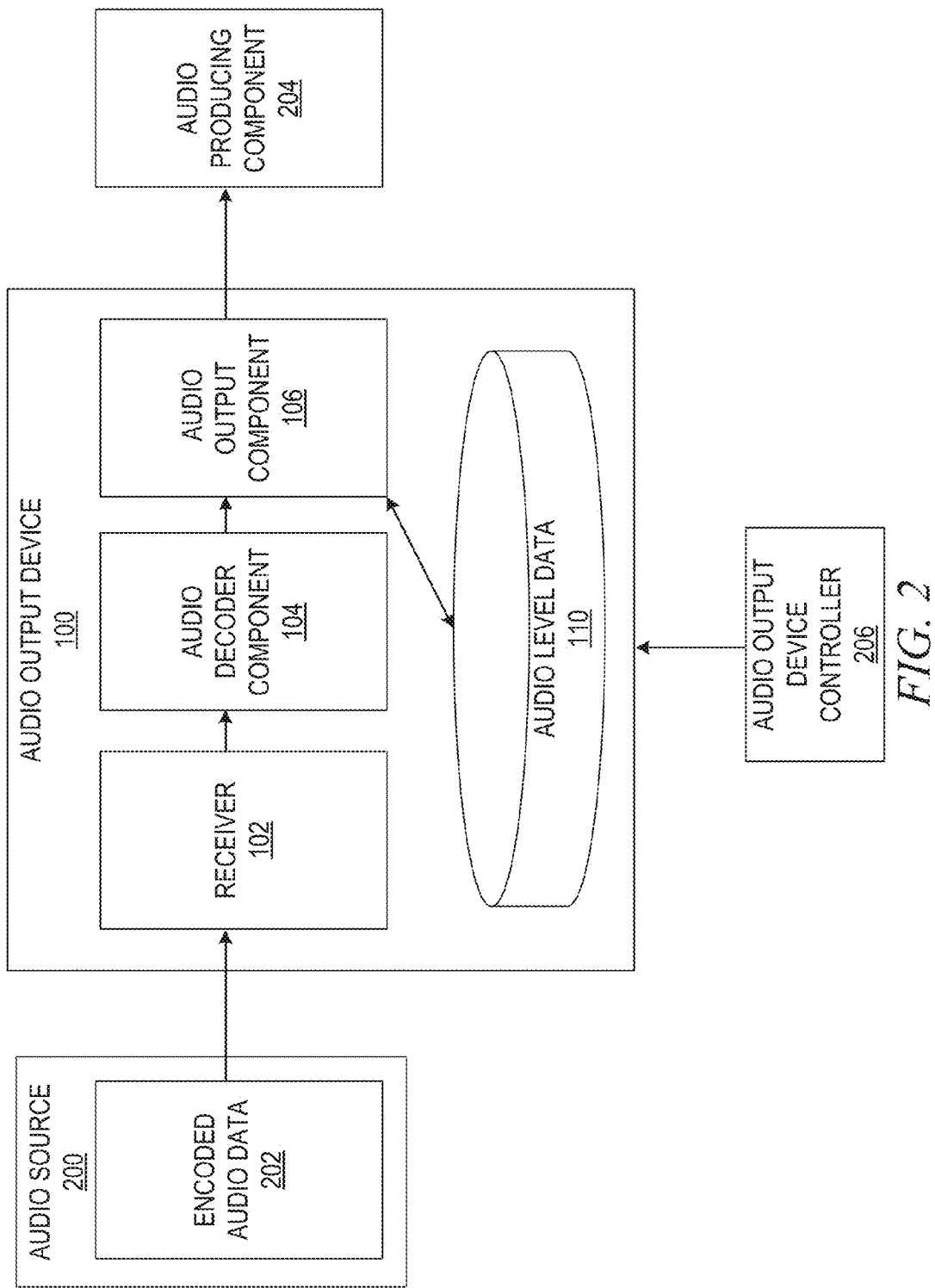
FIG. 2 is a data flow diagram illustrating a flow of data through the audio output device, according to some example embodiments.

FIG. 2 is a data flow diagram illustrating a flow of data through the audio output device 100, according to some example embodiments. The flow of data illustrated in FIG. 2 may be initiated by returning the audio output device 100 to an operational state (e.g., by turning-on the audio output device 100). As illustrated in FIG. 2, audio source 200 provides encoded audio data 202 to the audio output device 100 as input, which is received by the receiver 102. The receiver 102 then provides the encoded audio data 202 to the audio decoder 104 for decoding. Once the audio decoder 104 decodes the encoded audio data 202, the decoded audio data is provided to the audio output component 106.

The audio output component 106 then accesses audio level data from the audio level data storage 110. The audio level data includes values corresponding to previous audio levels of the audio output device 100. The audio output component 106 checks whether the value of the most recent audio level of the audio output device 100 transgresses a reference threshold value. If the value of the most recent audio level of the audio output device 100 is below the threshold value, an output audio signal generated from the decoded audio data is provided to the audio producing component 204 (e.g., a set of speakers) with the audio level of the output audio signal being set at the most recent audio level value.

If the value of the most recent audio level of the audio output device 100 is at or above the threshold value, an output audio signal generated from the decoded audio data is provided to the audio producing component 204 (e.g., a set of speakers) with the audio level of the output audio signal initially being set at the reference threshold value. The audio output component 106 then gradually increases the audio level of the audio output signal by a step value at repeated time intervals (e.g., periodic or aperiodic time intervals). In other words, the audio output component 106 increases the audio level of the output audio signal according to a stepwise function. Unless the audio output component 106 detects a user interrupt during the increase in audio level, the audio output component 106 continues to increase the audio level until it reaches the value of the most recent audio level.

If, on the other hand, the audio output component 106 does detect a user interrupt during the increase in audio level, the audio output component 106 stops increasing the audio level and maintains the audio level at a current value. The user interrupt may correspond to any number of commands to control the functionality of the audio output device 100 provided by an audio output device controller 206 communicatively coupled to the audio output device 100. For example, a listener of the audio output device 100 may use the audio output device controller 206 to adjust the audio level of the audio output device 100 (e.g., turn volume up, down, mute, etc.) or to toggle the audio output device 100 between operational and non-operational states (e.g., turn the audio output device 100 on or off). Accordingly, the audio output device controller 206 includes one or more buttons or other input mechanisms (e.g., a touch screen) to allow listeners to input the commands to control the audio output device 100. In some embodiments, the audio output device controller 206 is embedded in the audio output device 100. In some embodiments, the audio output device controller 206 is separate from the audio output device 100 though still able to remotely transmit commands to the audio output device 100. For example, the audio output device controller 206 may be an infrared (IR) remote controller capable of transmitting command signals to an IR receiver (not shown) embedded in the audio output device 100.

Figure 3:
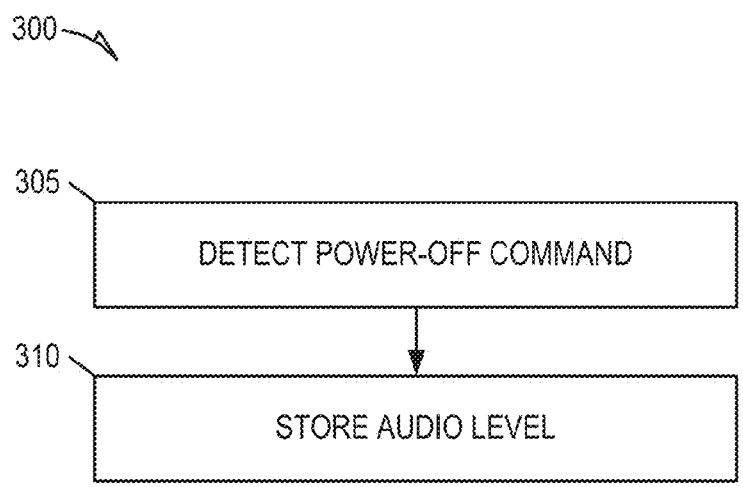
FIG. 3 is a flow chart illustrating a method for storing an audio level of an audio output device, according to some example embodiments.

FIG. 3 is a flow chart illustrating a method 300 for storing an audio level of an audio output device, according to some example embodiments. The method 300 may be embodied in machine-readable instructions for execution by a hardware component (e.g., a processor) such that the operations of the method 300 may be performed by the audio output device 100. In particular, the operations of the method 300 may be performed in part or in whole by the functional components of the audio output device 100 illustrated in FIG. 1; accordingly, the method 300 is described below, by way of example with reference thereto. However, it shall be appreciated that the method 300 may be deployed on various other hardware configurations and is not intended to be limited to the audio output device 100.

At operation 305, the audio output component 106 detects a command to place the audio output device 100 in a non-operational state (e.g., a command to turn-off the audio output device 100). The command may, for example, be input by a user using the audio output device controller 206, may be generated at the conclusion of a sleep timer, or may be generated in response to a signal received from a sensor (not shown).

In response to detecting the command, the audio output component 106 stores a value corresponding to the last audio level of the audio output device 100 prior to becoming non-operational. The audio output component 106 stores the audio level value in the audio level data storage 110 as a part of audio level data of the audio output device 100. Because the stored audio level value corresponds to the last audio level of the audio output device 100 prior to shutting down, the stored audio level value may also be referred to as the most recent audio level of the audio output device 100.

Figure 4:
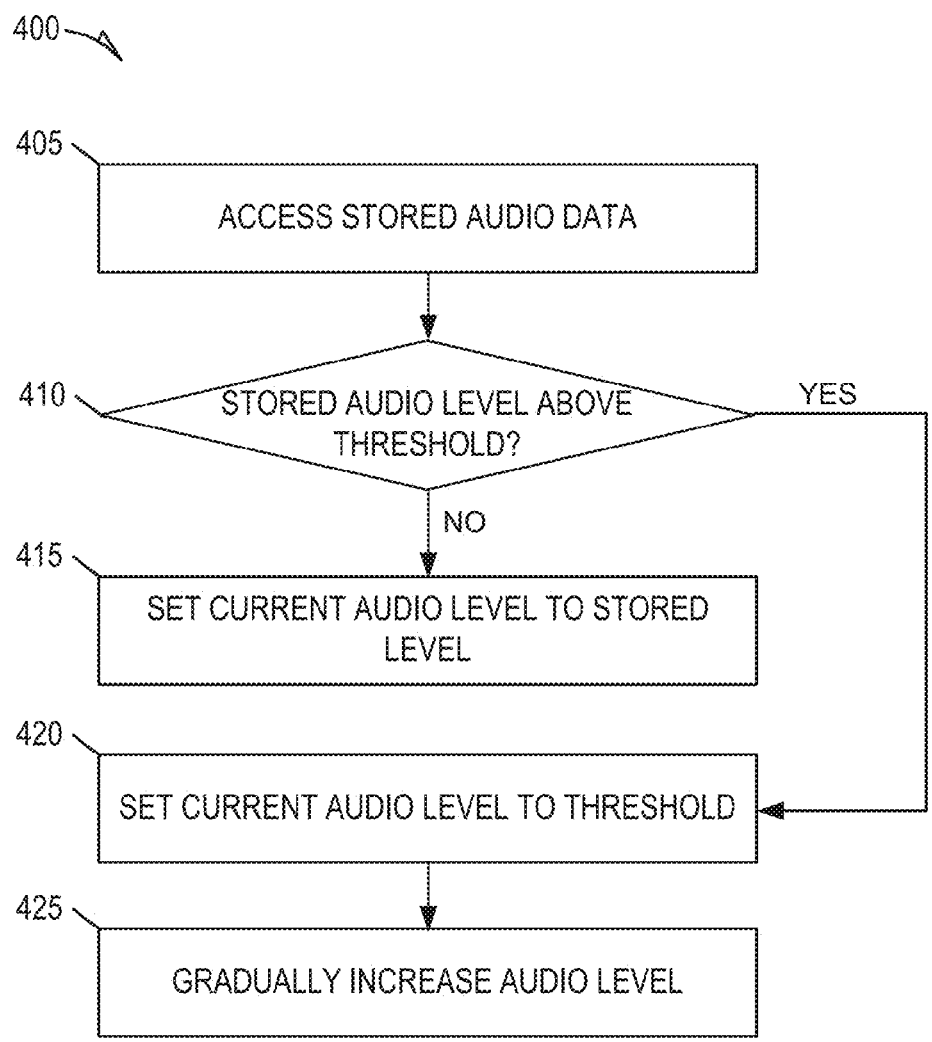
FIG. 4 is a flow chart illustrating a method for providing audio level safeguards, according to some example embodiments.

FIG. 4 is a flow chart illustrating a method 400 for providing audio level safeguards, according to some example embodiments. The method 400 may be embodied in machine-readable instructions for execution by a hardware component (e.g., a processor) such that the operations of the method 400 may be performed by the audio output device 100. In particular, the operations of the method 400 may be performed in part or in whole by the functional components of the audio output device 100 illustrated in FIG. 1, accordingly, the method 400 is described below, by way of example with reference thereto. However, it shall be appreciated that the method 400 may be deployed on various other hardware configurations and is not intended to be limited to the audio output device 100.

Consistent with some embodiments, the method 400 is initiated in response the audio output device 100 being returned to an operational state (e.g., the audio output device 100 being turned-on). At operation 405, the audio output component 106 accesses stored audio level data from the audio level data storage 110. The stored audio level data includes a stored audio level value. The stored audio level value may correspond to a most recent audio level of the audio output device 100. As discussed above in reference to FIG. 3, in some instances, the most recent audio level corresponds to the audio level of audio output device 100 prior to the audio output device 100 being placed in a non-operational state (e.g., the audio output device 100 being turned-off).

At operation 410, the audio output component 106 determines whether the stored audio level (e.g., the most recent audio level) is above a reference threshold value. The reference threshold value may be a preset value or may be dynamically configured by a user of the audio output device 100. The reference threshold value may, for example, correspond to an audio level that is comfortably heard by the human ear. For example, the reference threshold value may be based on the typical audio level of human conversation (e.g., 55 dB-65 dB).

If, at operation 410, the audio output component 106 determines the stored audio level (e.g., the most recent audio level) is below the reference threshold value, the audio output component 106 sets the current audio level of the audio output device 100 to the stored audio level value (e.g., the most recent audio level), at operation 415.

If, at operation 410, the audio output component 106 determines the stored audio level (e.g., the most recent audio level) is below the reference threshold value, the audio output component 106 sets the current audio level of output audio of the audio output device 100 to reference threshold value, at operation 420.

At operation 425, the audio output component 106 gradually (e.g., incrementally) increases the current audio level of the audio output device 100 (e.g., by increasing the power output of the audio output device 100). The audio output component 106 may, in some embodiments, increase the current audio level of the audio output by the audio output device 100 according to a stepwise function. For example, the audio output component 106 may increase the current audio level by an incremental value in the range of 2.5 dB to 3.5 dB. Without user intervention, the audio output component 106 increases the current audio level of the audio output device 100, at repeated time intervals (e.g., in the range of 20 milliseconds to 2 seconds), until it reaches the stored audio level value. The time intervals may be either periodic or aperiodic. For example, the intervals may vary as the audio level of the audio output by the audio output device 100 approaches the stored audio level. For example, the time interval between incremental increases may initially be 20 milliseconds, but may increase to 2 seconds as the audio output by the audio output device 100 approaches the stored audio level.

If, during operation 425, the audio output component 106 detects a user interrupt (e.g., a command entered using the audio output device controller 206), the audio output component 106 stops increasing the current audio level and maintains it at its current value. In other words, the audio output component 106 ceases further increase of the audio level. Further details of the operation 420, according to some example embodiments, are discussed below in reference to FIG. 5.

Figure 5:
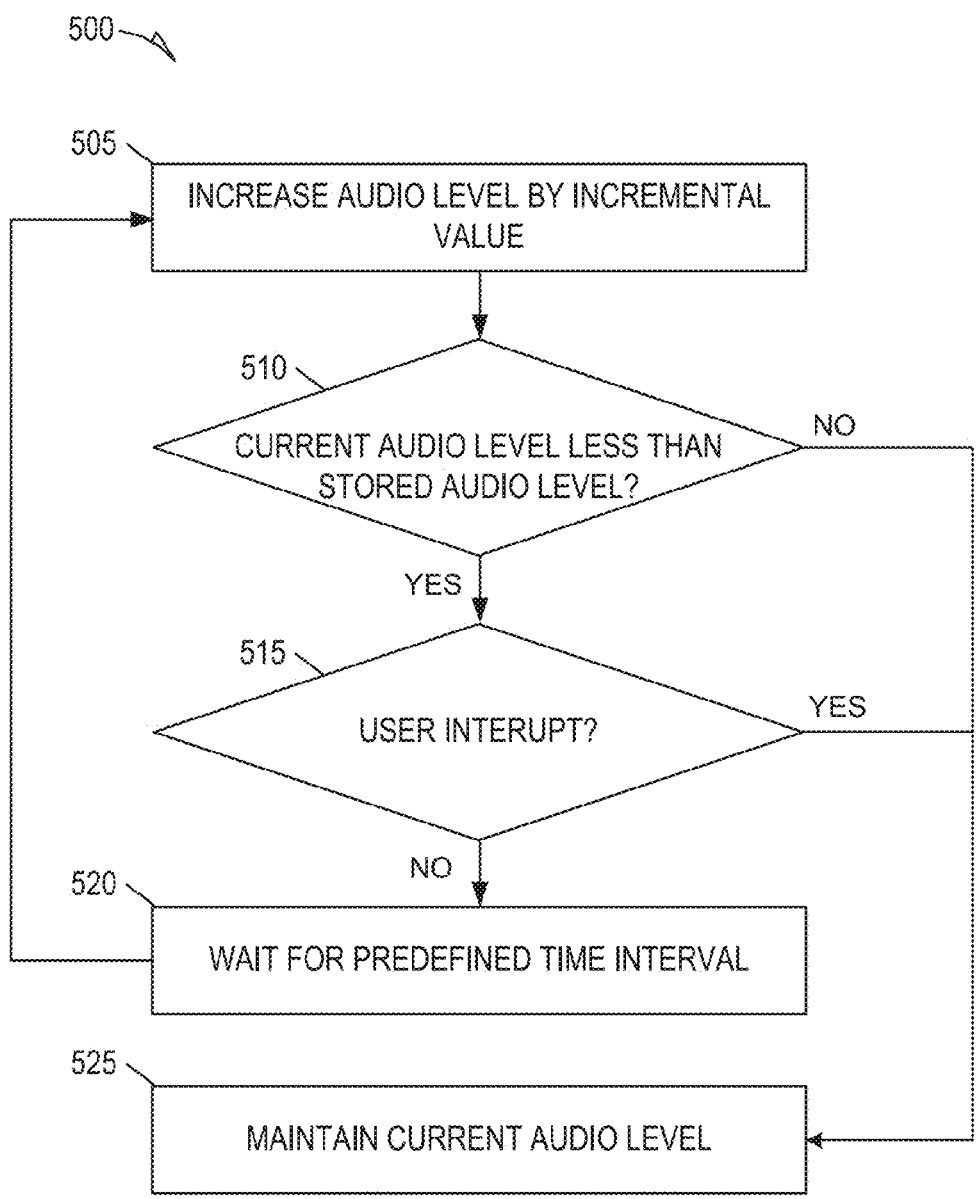
FIG. 5 is a flow chart illustrating a method for gradually increasing audio output levels of an audio output device, according to an example embodiment.

FIG. 5 is a flow chart illustrating a method 500 for gradually increasing audio output levels of an audio output device, according to an example embodiment. The method 500 may be embodied in machine-readable instructions for execution by a hardware component (e.g., a processor) such that the operations of the method 500 may be performed by the audio output device 100. In particular, the operations of the method 500 may be performed in part or in whole by the functional components of the audio output device 100 illustrated in FIG. 1, accordingly, the method 500 is described below, by way of example with reference thereto. However, it shall be appreciated that the method 500 may be deployed on various other hardware configurations and is not intended to be limited to the audio output device 100. Consistent with some embodiments, the operation 420 of method 400 may include the operations of method 500.

At operation 505, the audio output device 100 increases the current audio level of the audio output device 100 by an incremental value (e.g., in the range of 2.5 dB to 3.5 dB). The incremental value may be a preset value or may be dynamically configured by a user of the audio output device 100. The incremental value may, for example, correspond to an increase in audio level that is not perceivable to the human ear. For example, the reference threshold value may be based on the JND of sound intensity of the human ear.

More specifically, the reference threshold value may be a value slightly below the JND of sound intensity of the human ear.

At operation 510, the audio output component 106 determines whether the current audio level is less than the stored audio level value. If, at operation 510, the audio output component 106 determines the current audio level is less than the stored audio level value, the method proceeds to operation 515, where the audio output component 106 determines whether a user interrupt has been detected. The user interrupt may correspond to a command input using the audio output device controller 206. For example, the input command may correspond to a command to modify (e.g., increase or decrease) the audio level of the audio output device 100.

If, at operation 515, the audio output component 106 determines that no user interrupt has been detected, the method proceeds to operation 520 where the audio output component 106 waits for a predefined time interval before returning to operation 505. By waiting the predefined time interval before increasing the current audio level by an incremental value, the audio output component 106 causes the current audio level of the audio output of the audio output device 100 to be increased in gradual steps (e.g., increased according to a stepwise function). The predefined time interval may be a preset value or may be dynamically configured by a user of the audio output device 100. The predefined time interval may, for example, be in the range of 2 milliseconds to 2 seconds. In some embodiments, the time interval may vary as the audio level of the audio output by the audio output device 100 approaches the stored audio level.

If, at operation 515, the audio output component 106 determines that a user interrupt has been detected, the method proceeds to operation 525, where the audio output component 106 maintains the current audio level of the audio output device 100 by ceasing further increase. In other words, if a user interrupt is detected, the audio output component 106 stops increasing the current audio level.

If, at operation 510, the audio output component 106 determines the current audio level is the same as the stored audio level value, the method proceeds to operation 525, where the audio output component 106 maintains the current audio level of the audio output device 100 by ceasing further increase of the audio level by the incremental value. In other words, once the audio output component 106 increases the current audio level of the audio output device 100 to the stored audio level value, the audio output component 106 stops increasing the current audio level. In this way, the current audio level of the audio output device is incrementally increased from the reference threshold value to the stored audio level value (e.g., the most recent audio level). However, it shall be appreciated that, in some embodiments, the incremental value and the predefined time interval may be such that the audio level of the audio output device 100 is continuously increased from the reference threshold value to the stored audio level value.

Figure 6:
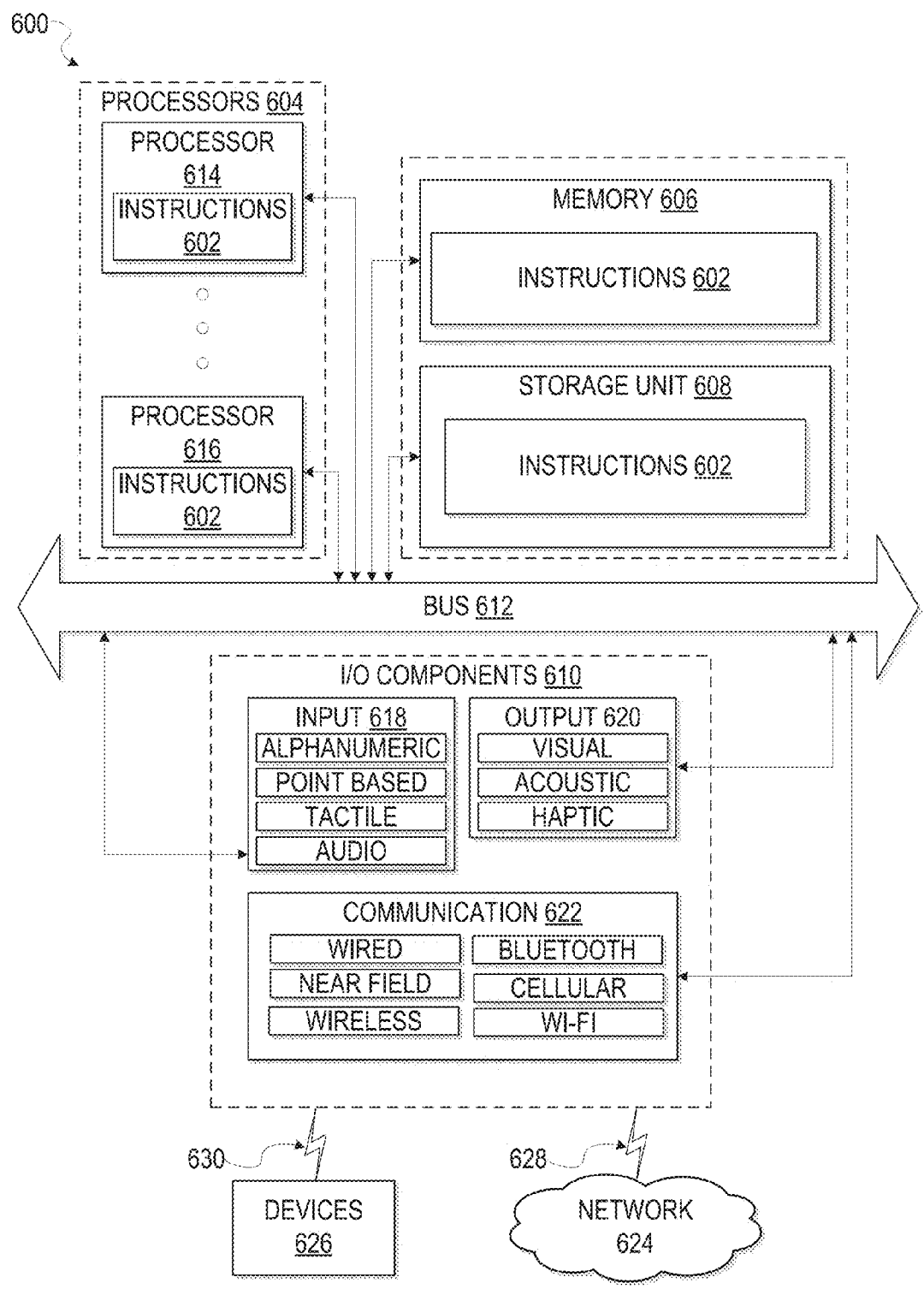
FIG. 6 is a diagrammatic representation of a machine in the example form of a computer system within which a set of instructions for causing the machine to perform any one or more of the methodologies discussed herein may be executed.

FIG. 6 is a block diagram illustrating components of a machine 600, according to some example embodiments, able to read instructions from a machine-readable medium (e.g., a machine-readable storage medium) and perform any one or more of the methodologies discussed herein. Specifically, FIG. 6 shows a diagrammatic representation of the machine 600 in the example form of a system, within which instructions 602 (e.g., software, a program, an application, an applet, an app, a driver, or other executable code) for causing the machine 600 to perform any one or more of the methodologies discussed herein may be executed. For example, the instructions 602 include executable code that causes the machine 600 to execute the methods 300, 400, and 500. In this way, these instructions 602 transform the general, non-programmed machine 600 into a particular machine programmed to carry out the described and illustrated functions of the audio output device 100 in the manner described herein. The machine 600 may operate as a stand-alone device or may be coupled (e.g., networked) to other machines.

By way of non-limiting example, the machine 600 may comprise or correspond to a television, a computer (e.g., a server computer, a client computer, a personal computer (PC), a tablet computer, a laptop computer, or a netbook), a set-top box (STB), a personal digital assistant (PDA), an entertainment media system (e.g., an audio/video receiver), a cellular telephone, a smart phone, a mobile device, a wearable device (e.g., a smart watch), a portable media player, or any machine capable of outputting audio signals and capable of executing the instructions 602, sequentially or otherwise, that specify actions to be taken by machine 600. Further, while only a single machine 600 is illustrated, the term "machine" shall also be taken to include a collection of machines 600 that individually or jointly execute the instructions 602 to perform any one or more of the methodologies discussed herein.

The machine 600 may include processors 604, memory 606, storage unit 608 and I/O components 610, which may be configured to communicate with each other such as via a bus 612. In an example embodiment, the processors 604 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, processor 614 and processor 616 that may execute instructions 602. The term "processor" is intended to include multi-core processor 604 that may comprise two or more independent processors (sometimes referred to as "cores") that may execute instructions contemporaneously. Although FIG. 6 shows multiple processors, the machine 600 may include a single processor with a single core, a single processor with multiple cores (e.g., a multi-core processor), multiple processors with a single core, multiple processors with multiples cores, or any combination thereof.

The memory 606 (e.g., a main memory or other memory storage) and the storage unit 608 are both accessible to the processors 604 such as via the bus 612. The memory 606 and the storage unit 608 store the instructions 602 embodying any one or more of the methodologies or functions described herein. The storage unit 608 is also configured to include the audio level data storage 110. The instructions 602 may also reside, completely or partially, within the memory 606, within the storage unit 608, within at least one of the processors 604 (e.g., within the processor's cache memory), or any suitable combination thereof, during execution thereof by the machine 600. Accordingly, the memory 606, the storage unit 608, and the memory of processors 604 are examples of machine-readable media.

As used herein, "machine-readable medium" means a device able to store instructions and data temporarily or permanently and may include, but is not be limited to, random-access memory (RAM), read-only memory (ROM), buffer memory, flash memory, optical media, magnetic media, cache memory, other types of storage (e.g., erasable programmable read-only memory (EEPROM)) and/or any suitable combination thereof. The term "machine-readable medium" should be taken to include a single medium or multiple media (e.g., a centralized or distributed database, or associated caches and servers) able to store instructions 602. The term "machine-readable medium" shall also be taken to include any medium, or combination of multiple media, that is capable of storing instructions (e.g., instructions 602) for execution by a machine (e.g., machine 600), such that the instructions 602, when executed by one or more processors of the machine 600 (e.g., processors 604), cause the machine 600 to perform any one or more of the methodologies described herein (e.g., method 300, 400, and 500). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 610 may include a wide variety of components to receive input, provide output, produce output, transmit information, exchange information, capture measurements, and so on. The specific I/O components 610 that are included in a particular machine 600 will depend on the type of machine 600. For example, portable machines such as mobile phones will likely include a touch input device or other such input mechanisms, while a headless server machine will likely not include such a touch input device. It will be appreciated that the I/O components 610 may include many other components that are not specifically shown in FIG. 6 (e.g., receiver 102, audio output component 106, and audio output device controller 206). The I/O components 610 are grouped according to functionality merely for simplifying the following discussion and the grouping is in no way limiting. In various example embodiments, the I/O components 610 may include input components 618 and output components 620. The input components 618 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components, and the like. The output components 620 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 610 may include communication components 622 operable to couple the machine 600 to a network 624 or devices 626 via coupling 628 and coupling 630 respectively. For example, the communication components 622 may include a network interface component or other suitable device to interface with the network 624. In further examples, communication components 622 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 626 may be another machine or any of a wide variety of peripheral devices (e.g., a peripheral device coupled via a Universal Serial Bus (USB) or the audio output device controller 206).

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired) or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network 624 (e.g., the Internet) and via one or more appropriate interfaces (e.g., APIs).

Electronic Apparatus and System

Example embodiments may be implemented in digital electronic circuitry, or in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network 624.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice. Below are set out hardware (e.g., machine) and software architectures that may be deployed, in various example embodiments.

Language

Although the embodiments of the present invention have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

All publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim are still deemed to fall within the scope of that claim.

What is claimed is:

1. A method comprising:
   accessing, on a machine-readable medium, stored audio data comprising a most recent audio level of an audio output device;
   comparing, using one or more processors, the most recent audio level with a reference threshold value; and
   based on an outcome of the comparing:
      setting a current audio level output by the audio output device to the reference threshold value;
      increasing, at repeated time intervals, the current audio level of the audio output device by an incremental value;
      determining the current audio level of the audio output device has been increased to a value corresponding to the most recent audio level; and
      in response to determining the current audio level has been increased to the value corresponding to the most recent audio level, maintaining the current audio level.

2. The method of claim 1, wherein the accessing of the stored audio data is in response to the audio output device being returned to an operational state.

3. The method of claim 1, wherein the most recent audio level is the audio level of the audio output device prior to the audio output device being placed in a non-operational state.

4. The method of claim 1, further comprising setting the current audio level of the audio output device to the most recent audio level based on determining the most recent audio level does not transgress the reference threshold level.

5. The method of claim 1, wherein the reference threshold level is between 55 dB and 65 dB.

6. The method of claim 1, further comprising:
   detecting a user interrupt received via a controller communicatively coupled to the audio output device; and
   in response to detecting the user interrupt, stopping the increasing of the current audio level.

7. The method of claim 6, wherein the user interrupt corresponds to an audio level adjustment function of an input device.

8. The method of claim 1, wherein the increasing of the current audio level includes increasing an output signal of the audio output device according to a step function.

9. The method of claim 1, wherein the most recent audio level is greater than the reference threshold value.

10. The method of claim 1, wherein the repeated time intervals and the incremental value are such that the increasing of the current audio level of the audio output device is continuous.

11. The method of claim 1, wherein the current audio level corresponds to a measure of loudness of output audio of the audio output device.

12. The method of claim 1, wherein the incremental value corresponds to a just noticeable difference (JND) value of sound intensity.

13. The method of claim 1, wherein the maintaining the current audio level of the audio device includes ceasing further increase of the audio level.

14. A device comprising:
   a machine-readable storage medium to store audio level data, the audio level data including a most recent audio level of an audio output device; and
   an audio output component, comprising one or more processors, configured to perform operations comprising:
   comparing the most recent audio level to a reference threshold value; and
   based on an outcome of the comparing:
      setting a current audio level output by the audio output device to the reference threshold value;
      increasing, at repeated time intervals, the current audio level of the audio output device by an incremental value;
      determining the current audio level of the audio output device has been increased to a value corresponding to the most recent audio level; and
      in response to determining the current audio level has been increased to the value corresponding to the most recent audio level, maintaining the current audio level.

15. The audio output device of claim 14, wherein the audio output component is further configured to perform operations comprising:
   detecting a user interrupt received via a controller communicatively coupled to the audio output device; and
   in response to detecting the user interrupt, stop increasing the current audio level.

16. The audio output device of claim 14, wherein the audio output component is further configured to perform operations comprising setting the current audio level of the audio output device to the most recent audio level based on determining the most recent audio level does not transgress a predefined audio threshold level.

17. The audio output device of claim 14, wherein the audio output component is further configured to perform operations comprising storing the most recent audio level in the machine-readable storage medium prior to the audio output device being placed in a non-operational state.

18. The audio output device of claim 14, wherein the current audio level is measured in decibels.

19. The audio output device of claim 14, wherein the repeated time intervals are between 20 milliseconds and 2 seconds.

20. A system comprising:
   at least one processor of a machine; and
   a non-transitory machine-readable storage medium embodying instructions that, when executed by at least one processor of the machine, cause the machine to perform operations comprising:
   accessing, on a machine-readable medium, stored audio data comprising a most recent audio level of an audio output device;
   determining, using the one or more processors, whether the most recent audio level transgresses a reference threshold value;
   based on determining the most recent audio level does not transgress the reference audio threshold level, setting the current audio level of the audio output device to the most recent audio level; and
   based on determining the most recent audio level transgresses the reference threshold value:

setting a current audio level output by the audio output device to the reference threshold value;

increasing, at repeated time intervals, the current audio level of the audio output device by an incremental value;

determining the current audio level of the audio output device has been increased to a value corresponding to the most recent audio level; and in response to determining the current audio level has been increased to the value corresponding to the most recent audio level, maintaining the current audio level.

* * * * *